United States Patent
Chung (10) Patent No.: US 6,316,289 B1
(45) Date of Patent: Nov. 13, 2001

(54) METHOD OF FORMING FINE-PITCH INTERCONNECTIONS EMPLOYING A STANDOFF MASK

(75) Inventor: Kevin Kwong-Tai Chung, Princeton Township, NJ (US)

(73) Assignee: Amerasia International Technology Inc., Princeton Junction, NJ (US)

( * ) Notice: Subject to any disclaimer, the term of this patent is extended or adjusted under 35 U.S.C. 154(b) by 0 days.

(21) Appl. No.: 09/276,245

(22) Filed: Mar. 25, 1999

Related U.S. Application Data (62) Division of application No. 09/190,837, filed on Nov. 12, 1998.
(60) Provisional application No. 60/112,774, filed on Dec. 18, 1998.

(51) Int. Cl.$^7$ .................................................... H01L 21/44
(52) U.S. Cl. .................................................. 438/118
(58) Field of Search .................................... 438/107, 108, 438/118, 119; 29/830, 831, 832; 156/299, 307.3

(56) References Cited

U.S. PATENT DOCUMENTS

| | | |
|---|---|---|
| 2,014,524 | 9/1935 | Franz . |
| 2,774,747 | 12/1956 | Wolfson et al. . |
| 3,401,126 | 9/1968 | Miller et al. . |
| 3,429,040 | 2/1969 | Miller . |
| 4,113,981 | 9/1978 | Fujita et al. . |
| 4,442,966 | 4/1984 | Jourdain et al. . |
| 5,046,415 | 9/1991 | Oates . |
| 5,056,296 | 10/1991 | Ross et al. . |
| 5,074,947 | 12/1991 | Estes et al. . |
| 5,196,371 | 3/1993 | Kulesza et al. . |
| 5,237,130 | 8/1993 | Kulesza et al. . |
| 5,539,153 | 7/1996 | Schwiebert et al. . |
| 5,611,140 | * 3/1997 | Kulesza et al. ............... 29/832 |
| 5,667,884 | 9/1997 | Bolger . |
| 5,879,761 | 3/1999 | Kulesza et al. . |

OTHER PUBLICATIONS

P. Scharf, T. Coleman and K. Avellar, "Flip Component Technology", IEEE Electronic Component Conference (1967), pp. 269–274.

(List continued on next page.)

*Primary Examiner*—Keith Christianson
(74) *Attorney, Agent, or Firm*—Dann, Dorfman, Herrell and Skillman, P.C.

(57) ABSTRACT

In the construction of electronic devices with one or more flip chips and, in some cases, one or more leadless components, mounted on a substrate, the interconnections are made with conductive adhesive or solder paste deposited using specialized stencils or masks, including suitable snap-back stencils and direct-contact masks without snap back. A metal stencil (or mask) is placed temporarily onto the face of a substrate, such as a semiconductor wafer, circuit board or other substrate, and is spaced apart therefrom by standoff features. When the stencil is properly positioned with respect to the wafer or substrate, as by relational alignment holes or optical alignment methods, conductive adhesive material is deposited onto the substrate through holes or openings in the stencil. The metal stencil includes on the side thereof facing the substrate a flexible standoff layer having standoff features to space the stencil apart from the substrate. The flexible standoff features are spaced away from the openings of the stencil so as to facilitate the forming of fine features of the conductive paste that have a height that is substantially greater than the thickness of the metal stencil, while avoiding smearing of the conductive adhesive paste and avoiding the conductive adhesive paste adhering to the openings of the stencil rather than to the substrate. Standoff features are formed by depositing suitable adhesive or metal materials or by etching the metal stencil. Openings in the metal stencil are formed by suitable means such as laser cutting, electroforming or photo-etching. The stencil may be fabricated of a membrane of magnetic material and be held in place by the magnetic forces produced by an electromagnet included in the assembly tooling.

40 Claims, 5 Drawing Sheets

OTHER PUBLICATIONS

Gilleo, K: "Direct Chip Interconnect Using Polymer Bonding", IEEE 39th Electronic Component Conference, May 1989, pp37–44.

R. Lachance, H. Lavoie, A Montanari, "Corrosion/Migration Study of Flip Chip Underfill and Ceramic Overcoating", IEEE Electronic Components and Technology Conference (1997), pp. 885–889.

T.Y. Wu, Y. Tsukada, W.T. Chen, "Materials and Mechanics Issues in Flip–Chip Organic Packaging", IEEE Electronic Components and Technology Conference (1996), pp. 524–534.

B. Rösner, J. Liu, Z. Lai, "Flip–Chip Bonding Using Isotopically Conductive Adhesives", Electronic Components and Technology Conference, (1996) pp. 578–581.

D. Gamota, C. Melton, "Advanced Encapsulant Materials Systems for Flip Chip", Advancing Microelectronics (Jul./Aug. 1997) pp. 22–24.

R.W. Johnson, D. Price, D. Maslyk, M. Palmer, S. Wentworth, C. Ellis, "Adhesive Based Flip Chip Technology for Assembly on Polyimide Flex Substrates", IEEE International Conference on Mulitchip Modules, 1997, pp. 81–86.

L. Schaper, K. Maner, S. Ang, "Reliability of Large Conductive Polymer Flip Chip Assemblies for Multichip Modules (MCMs)", IEEE International Conference on Multichip Modules (1997), pp. 87–91.

Dr. V. Ozguz, R. DeLosReyes, Dr. K. Chung, Dr. J. Licari, "Flexible Conductive Adhesive Bumps for Chip Scale Packaging", The Technical Conference At Chip Scale International, May 1998, pp. 15–19.

K. Chung, V. Ozguz, "Flexible Conductive Adhesives as Solder Replacement in Flip Chip Interconnection", Proceedings Semicon West 1998, Jul. 1998, pp. 1–14.

"Cost Effective Solutions for Advanced Semiconductor Interconnection and Packaging", AI Technology, Inc., Jul. 1998.

Product Catalog No. 500, "Magnetool Electromagnets", Magnetol, Inc., pp. 1, 5–7, 12.

"Laminated Stencils The Power Behind Fine Pitch," UTZ Engineering, Inc., (2 sheets).

\* cited by examiner

METHOD OF FORMING FINE-PITCH INTERCONNECTIONS EMPLOYING A STANDOFF MASK

This Application claims the benefit of U.S. Provisional Application Ser. No. 60/112,774 filed Dec. 18, 1998 and of U.S. patent application Ser. No. 09/190,837 filed Nov. 12, 1998.

The present invention relates to fine pitch interconnections and, in particular, to a method for forming fine pitch interconnections and to a standoff mask employed therein.

Flip chip semiconductor devices and other leadless electronic components that require fine-pitch interconnections (the "pitch" being the center-to-center spacing of adjacent contacts and/or connections) are becoming more and more important for the more advanced electronic devices because the reduction in physical size that they afford can accommodate the ever-increasing need for more input and output connections and increasing operating frequencies utilized in modern computers and communication equipment. Thus, the ability to deposit interconnection materials such as solder pastes and conductive adhesives at decreasing pitch is becoming more and more desirable.

Stenciling and screening techniques have been employed for depositing solder pastes and conductive polymers have been around and used for more than 60 years, as exemplified by U.S. Pat. No. 2,014,524 issued to Franz in 1935. The same basic technique has recently been extended to high precision deposition by employing photo-etching and laser-cutting techniques for forming very small openings in stencils.

The use of stenciling and screening techniques for depositing solder pastes is discussed by Speckled et al. in "Soldering Techniques for Surface Mounted Leadless Chip Carrier", published in *Proceedings of the International Symposium on Microelectronics*, October 1986, pages 902–913, and for depositing conductive adhesives is disclosed by Kulesza and Estes in U.S. Pat. No. 5,074,947, entitled "Flip Chip Technology Using Electrically Conductive Polymers and Dielectrics," U.S. Pat. No. 5,196,371, entitled "Flip Chip Bonding Method Using Electrically Conductive Polymer Bumps," U.S. Pat. No. 5,237,130, entitled "Flip Chip Technology Using electrically Conductive Polymers and Dielectrics," and U.S. Pat. No. 5,611,140, entitled "Method of Forming Electrically Conductive Polymer Interconnects on Electrical; Substrates," and is reviewed by Gilleo in "Direct Chip Interconnection Using Polymer Bonding", 39*th Electronic Component Conference*, May 1989, pages 37–44.

Each deposit of interconnection material, be it a solder paste or a conductive polymer adhesive, and be it wet as deposited or dried, is often referred to as a "bump" as in, for example, a "solder bump" or an "adhesive bump."

While some experiments may have employed stenciling and screening techniques to deposit materials with spacing in the range of 50 microns, in actual practice it has been difficult to consistently achieve a pitch of about 100 microns. More importantly, when contact pad size is small so that the size of the material bump deposited on the contact pads and the stencil openings through which it is deposited are correspondingly small, the thickness of the stencil or mask must be even thinner so as to avoid the deposited material remaining in the stencil openings rather than adhering to the contact pads. For example, if the stencil openings are 75 microns, the stencil thickness must be substantially thinner than 75 microns so that the surface area on the substrate in contact with the deposited material is larger than the surface area of the tubular opening in the stencil, and the material will adhere to the contact pads on the substrate rather than to the stencil. Typically, the thickness of the stencil is kept at about one-half the diameter of the smallest stencil openings, but thin stencils for forming fine features, e.g., less than 100 microns, are undesirably fragile and easily torn.

In direct contact deposition as is employed in most of the stenciling methods, the wet thickness of the deposited material will be about the same as the stencil thickness. Thus, if the stencil is only 50 microns thick, the deposited conductive paste will be about 50 microns thick when wet and typically will be substantially thinner when dried, as by solvent removal, to become dry bumps on the contact pads. For example to deposit 75 micron bumps on contact pads at a 150-micron pitch using a 50-micron thick stencil, the 50-micron thick wet conductive paste will dry to a finished thickness (or feature height) that may be as thin as 25–35 microns. This thickness or height is too little to form interconnections between an electronic component and the substrate, even with a flexible conductive adhesive interconnection material, that will withstand the internal stress induced by the differences in thermal expansion of the electronic component and the substrate that are bonded together to form a functional electronic device. In fact, in the case of solder paste and higher-strength conductive adhesive interconnections, this thickness will not allow the use of an adhesive underfill that is necessary to withstand such induced stress, and is thus basically unusable.

U.S. Pat. No. 5,046,415 to Oates entitled "Composite Stencil For Screen Printing" describes a composite stencil that includes a layer of metallic material such as brass and a layer of flexible material bonded to the metallic layer to form a seal for the screen printing of solder paste. Two problems of the Oates composite stencil are that the stencil is too thick to be employed to form very fine features, i.e. if made thin enough it would likely tear, and that the wet paste can adhere to either the metallic layer or the flexible layer of the stencil, or both, and thus remain in the openings in the stencil. The flexible layer of Oates is used to provide a seal or dam for the solder paste, and there is no suggestion as to how to form fine features, or of how to solve the problems of stencil tearing or of paste adhering to the stencil. Moreover, likely smearing of the deposited wet paste when the Oates stencil is removed renders the Oates stencil unsuitable for depositing very fine bumps, for example, of solder paste.

Certain commercial laminated stencils are made up of two or three separate metal foils of brass or stainless steel bonded together to form a single stencil of varying thickness, and are intended to be used to print two or three different solder thicknesses in a single pass. To do this, the side of the stencil being the foil with the smallest openings must be against the object onto which the solder is to be deposited and the solder must be applied onto the side of the stencil being foils, if any, having larger openings. Claims regarding such stencils that "clearances as small as 0.020" between components are workable" do not provide for the fine feature sizes (e.g., 25–50 microns) and fine pitches (e.g., 100–200 microns) required by modern semiconductor devices and electronic circuits. (Note that 0.020 inches=20 mils=500 microns).

One of the most difficult aspects of depositing adhesive paste onto a semiconductor wafer is the fact that extremely small amounts of adhesive paste must be deposited onto a multiplicity of very small, e.g., 50–100 microns, contact pads that are situated on a large circular wafer structure, e.g., 6 inches or more in diameter. Alignment of such masks and wafers can generally be achieved only with high precision equipment and a relatively expensive process.

Accordingly, there is a need for an accurate, repeatable and low cost method of depositing conductive pastes at very fine feature sizes. It is desirable that such very fine features could be deposited onto large-area substrates, such as a 6" or 8" diameter semiconductor wafer or a large (perhaps 18 inches or larger) printed wiring circuit board, including the accurate alignment and holding of the stencil or mask in position with respect to the substrate.

To this end, the method of the present invention for forming a pattern of adhesive on a substrate comprises:

obtaining a substrate having a pattern of sites thereon on which adhesive is to be deposited;

obtaining a standoff mask including a metal sheet having a pattern of openings corresponding to the pattern of sites and having standoff features thereon spaced away laterally from the openings;

positioning the substrate and the standoff mask proximate each other with the standoff features proximate the substrate so that the pattern of sites and the pattern of openings correspond;

applying adhesive to substantially fill and pass through the openings of the standoff mask and to contact the sites on the substrate; and removing the standoff mask to leave the adhesive on the pattern of sites.

According to another aspect of the present invention, a standoff mask comprises a metal membrane having a pattern of openings therethrough and a patterned layer of flexible material on at least one side of the metal membrane. The patterned layer has a pattern of openings therethrough corresponding to the pattern of openings in the metal membrane, wherein the flexible material is spaced away laterally from at least ones of the openings in the metal membrane.

BRIEF DESCRIPTION OF THE DRAWING

The detailed description of the preferred embodiments of the present invention will be more easily and better understood when read in conjunction with the FIGURES of the Drawing which include.

DESCRIPTION OF THE PREFERRED EMBODIMENT

The standoff stencil according to the present invention includes standoff features on a metal sheet to space the metal sheet apart from an object on which material is to be deposited by employing the standoff stencil. The standoff features are spaced away laterally from openings or holes in the metal sheet through which such material is to be deposited so as not to be contacted by the deposited material. Among the benefits of this arrangement are the ability to deposit material of smaller size (smaller crosswise dimension) than conventional stencils allow, to increase the height of such material deposits relative to their crosswise dimension, and to avoid smearing of the deposited during removal of the stencil, and to improve the consistency and uniformity of the material deposits. Thus higher and finer deposits of material are produced without increasing the thickness of the metal sheet in which are the deposition openings, i.e. without increasing the interior peripheral surface area associated with the openings, while reducing the tendency of the material being deposited to remain in the openings of the stencil.

Figure 1:
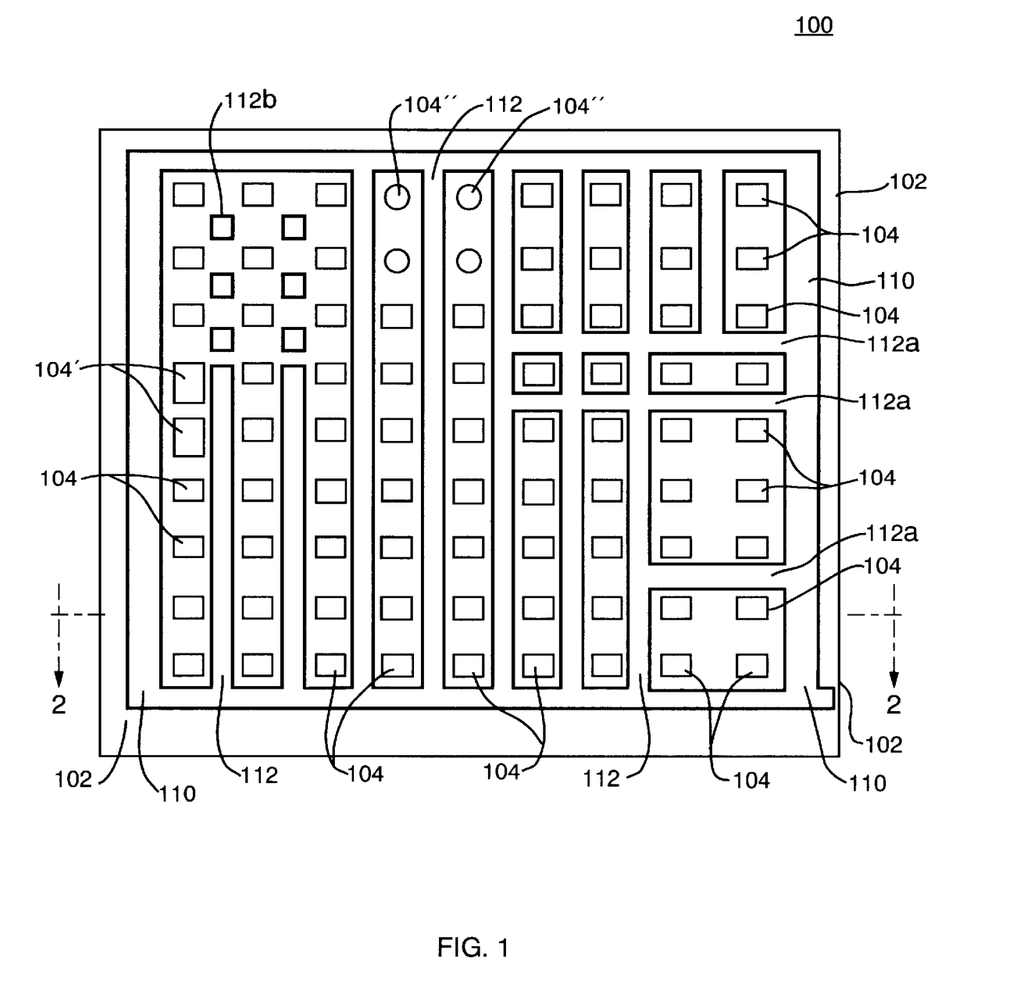
FIG. 1 is a plan view of an exemplary embodiment of a stencil in accordance with the present invention.

FIG. 1 is a plan view of an exemplary standoff stencil or mask 100, in particular, the surface thereof that is placed against a substrate onto which conductive paste is to be deposited in the pattern defined by the pattern of openings 104 through standoff stencil 100. Standoff stencil 100 includes a thin metal sheet or membrane 102 having a plurality of openings 104 therethrough arranged in a pattern corresponding to the pattern of bumps of conductive paste that are to be deposited on a substrate. Thin metal sheet 102 may be a sheet or membrane of brass, steel, stainless steel (magnetic or non-magnetic), carbon steel, nickel alloy, iron alloy molybdenum, titanium or other high-strength metal, their alloys, and laminates of sheets thereof. Note that the thickness of thin metal sheet 102 is selected to be substantially less than the crosswise dimension of the openings 104 (e.g., the edge dimension of the openings 104 if they are square 104 or rectangular 104' openings, and the diameter of openings 104" if the openings 104" are circular), and is typically about one half or less of the dimension of openings 104. Openings 104 in metal sheet 102 may be made by die cutting or by laser machining or electroforming where openings of small size are desired.

Standoff stencil 100 also includes a flexible standoff layer 110 on thin metal sheet 102. Flexible standoff layer 110 is formed in a pattern to define standoff features 112 that are spaced laterally away from the openings 104 in metal sheet 102 a distance sufficient to not come into contact with the conductive paste to be deposited therethrough. Flexible standoff layer 110 may be formed of flexible epoxy, cross-linkable epoxy, cross-linkable polyurethane, cross-linkable silicone, cured thermosetting and thermoplastic polymeric adhesives, and other suitable polymer coatings, and may be applied onto metal sheet 102 through a screen, stencil or mask, or by printing, ink-jet printing or other suitable means for depositing a pattern of such material, by lamination or application of a preform, or may be patterned by photo-etching, photo-imaging and developing, or electroforming. The material selected for forming standoff layer 110 should be resistant to the solvent or solvents employed in the conductive paste or pastes to be deposited using standoff stencil 100 as well as those used to clean standoff stencil 100. The preferred polymer conductive adhesives comprise thermoplastic and thermosetting polymers having a substantial portion of its molecular structure being flexible with a glass transition temperature Tg that is below ambient temperature (i.e. 20–25° C.).

Figure 2:
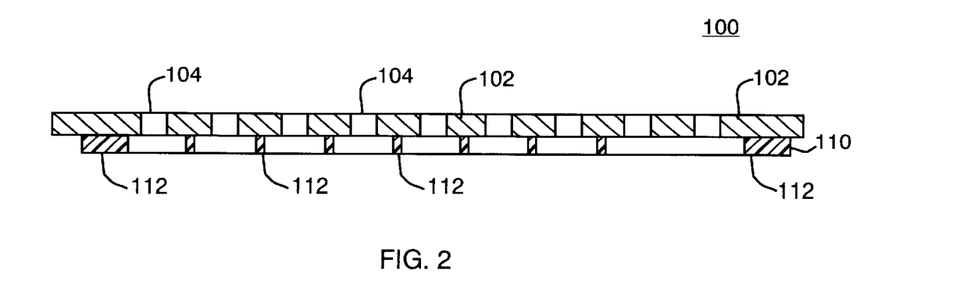
FIG. 2 is a cross-sectional view of the exemplary embodiment of the stencil of FIG. 1 taken at Section Line 2—2.

FIG. 2 is a cross sectional view of the standoff stencil 100 of FIG. 1 taken at the section line 2—2 thereof. Standoff features 112 of standoff layer 110 are positioned on metal sheet 102 so that metal sheet 102 and the openings 104 therein will be spaced apart from the substrate by the height of standoff features 112. Standoff features 1 12 are spaced away laterally from the openings 104 in metal sheet 102 so that conductive paste deposited through openings 104 will not contact stand off features 112. In certain instances where deposits of conductive paste is to be made at a very fine pitch so that it may be possible for the conductive paste to come into contact with part of one or more standoff features 112 even though the standoff features 112 are spaced away laterally from openings 104, the material selected for standoff layer 110 from which standoff features 112 are formed should have a low surface energy, for example, less than about 50 dyne/cm and preferably less than about 40 dyne/cm. Typically, the standoff feature 112 pattern near the edges of the standoff layer 110 may be wider so as to provide greater bearing area between standoff stencil 100 and the substrate to which it is to be employed, as may be other standoff features 112 where the pattern of openings 104 in metal sheet 102 is more widely spaced so as to permit wider standoff features 112. In fact, the arrangement of the pattern of standoff features 112 may be selected to encompass groups of one or more openings 104 or may be selected to form features 112 that do not encompass any opening, as is described below.

The shape of standoff stencil 100 may conveniently follow the shape of the substrate with which it will be employed, although it need not, however, it is preferred that the stencil be substantially larger than the substrate. For example, if a standoff stencil 100 is to be employed with a 6-inch diameter circular semiconductor wafer, then it is convenient for standoff stencil 100 to be circular with a diameter of about 6 inches or greater, and it is convenient to have parallel and orthogonal standoff features corresponding to the lines or "streets" between individual semiconductor dies where the wafer will be cut to produce the individual dies. If the individual dies have contacts around their peripheries, but not in their centers, standoff features may be formed corresponding to the center areas of the individual dies. Similarly, if standoff stencil 100 is to be employed with a rectangular printed wiring circuit board, then it will generally be convenient for standoff stencil 100 to be rectangular with approximately the same or greater dimensions than those of the circuit board, and standoff features are arranged to correspond to areas in which no conductive paste is to be deposited. The standoff stencil is mounted into a large frame by conventional screen mounting methods that allows suitable snap back following deformation for direct contact deposition in response to squeegee or roller motion during the deposition process.

Metal sheet 102 of standoff stencil 100 may be fabricated by at least three methods that are capable of producing from thin metal membranes stencils and masks with suitable resolution to produce fine features at fine pitch over areas as large as a semiconductor wafer. It is noted that both the dimension of the stencil openings 104 (which is the same as the dimension of the deposited features) as well as the tolerance in its physical location, both absolutely and in relation to other openings and features are of importance in fabricating standoff stencil 100. In general, the fabrication method producing the finest feature dimension will ordinarily also produce the lowest tolerance dimension associated with physical position over the area of the mask.

The lowest cost method for fabricating metal sheet 102 of standoff stencil 100 is conventional photo-etching of the sort commonly employed for fabricating thick film circuits and depositing solder paste. In this method, a photosensitive layer is first deposited onto a thin metal sheet, such as brass or stainless steel membrane, and is then exposed to form, for example, a cross-linked polymer. A pattern of openings corresponding to the pattern of openings 104 is made in the photosensitive layer by areas thereof which are left unexposed and are then washed away by a solvent to expose the metal sheet 102 underneath, leaving the rest of the metal sheet 102 protected by the exposed photosensitive layer. An acid or other etching chemical is applied to etch away those exposed areas of metal sheet 102 to form openings 104 therethrough in the pattern of openings 104. The current state of photo-etching technology is able to produce a pattern of 125-micron openings in metal sheets having a thickness of 50 microns or more.

A second method of fabricating metal sheet 102 of standoff stencil 100 that is cost effective employs laser machining. A beam produced by a high power laser having a fine beam focus is used to heat up those areas of the metal sheet 102 at which openings corresponding to the pattern of openings 104 are to be made and the energy of the laser beam vaporizes or evaporates away the metal to form openings in the metal sheet 102. The energy level of the laser beam is selected to be sufficient to vaporize the material to be removed in a controlled fashion, but is not so high as to damage surrounding areas of the material, be that the metal sheet 102 of standoff stencil 100 or the material of the standoff layer 120. Laser machining technology is advancing and can currently machine openings and other features having dimensions of less than 10 microns, but at higher cost than that of photo-etching.

The most precise openings and the finest features may be achieved by a third method known as electroforming. In this technique, the same photo-resist materials that are used in conventional semiconductor wafer processing are used to form the fine openings and features, and electroplating or electroforming or electro-depositing is used to build up a thin metal foil. Precision openings having a dimension as fine as 2.5 microns have been fabricated by electroforming. Other methods, such as screen emulsion and die cutting, may also be employed. Combinations of two or three of the foregoing techniques may be employed for better cost effectiveness, such as where both fine and larger openings and features are to be formed in the same metal membrane.

It is noted that standoff layer 110 may be patterned by photo-etching, i.e. depositing a photo-imagable material thereon, exposing the photo-imagable material to the desired pattern of openings, developing the photo-imagable material, removing the exposed portions of the photo-imagable material, and then etching the desired pattern into the standoff layer 110. Alternatively, the pattern of standoff features 112 of standoff layer 110 may be built up on metal sheet 102 as by electroforming such features 112 thereon in a reverse pattern of the pattern of openings desired for standoff layer 110, i.e. spaced away laterally from the openings 104 in metal sheet 102. Further, the pattern of standoff features may be formed by selectively etching a metal sheet 102, as by photo-etching, i.e. depositing a photo-imagable material thereon, exposing the photo-imagable material to the desired pattern of standoff features 112, developing the photo-imagable material, removing the exposed portions of the photo-imagable material, and then etching metal sheet 102 to leave the desired pattern of standoff features 112.

Various arrangements of the pattern of the standoff features 112 may be employed in the standoff stencil 100. Certain exemplary variations are illustrated in FIG. 1 wherein the basic exemplary pattern comprises a number of parallel features 112 patterned onto the areas of metal sheet 102 between lines of openings 104 therein. In addition, standoff features 112a orthogonal to the parallel standoff features 112 may be employed to for rectangular or square areas encompassing groups of openings 104. Examples thereof in FIG. 1 encompass groups of one, two, four and six openings 104. Standoff features 112b, for example, are located in the areas intermediate groups of four adjacent openings 104, and may be advantageous where the openings 104 are at a very fine pitch. The arrangements of standoff features 112, 112a, 112b need not be regularly shaped, but may be irregularly or arbitrarily shaped in any desired arrangement in which they are spaced away laterally from the openings 104 in metal sheet 102 of standoff stencil 100. While the material of which standoff layer 110 is formed may be either a rigid or a flexible material, if a rigid material is used, the standoff features must be made small enough and be distributed so as to allow deformation of the standoff stencil or mask 100 in use, i.e. in the process of deposition of conductive paste. If standoff features 112, 112a, 112b are employed that cover a large area of metal sheet 102, then the material of which such features are formed must likewise be flexible as is the metal sheet 102 to allow deformation during deposition.

Figure 3:
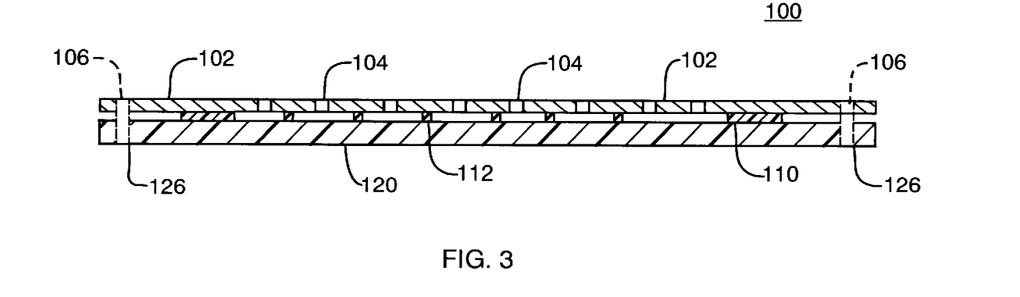
FIG. 3 is a side cross-sectional view of an exemplary stencil proximate an exemplary substrate in accordance with the present invention.
Figure 4:
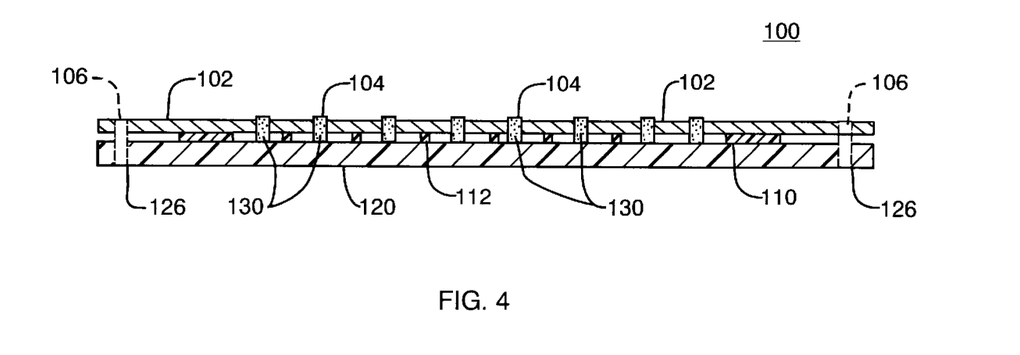
FIG. 4 is a side cross-sectional view of the exemplary stencil proximate the exemplary substrate of FIG. 3 after deposition of conductive paste.
Figure 5:
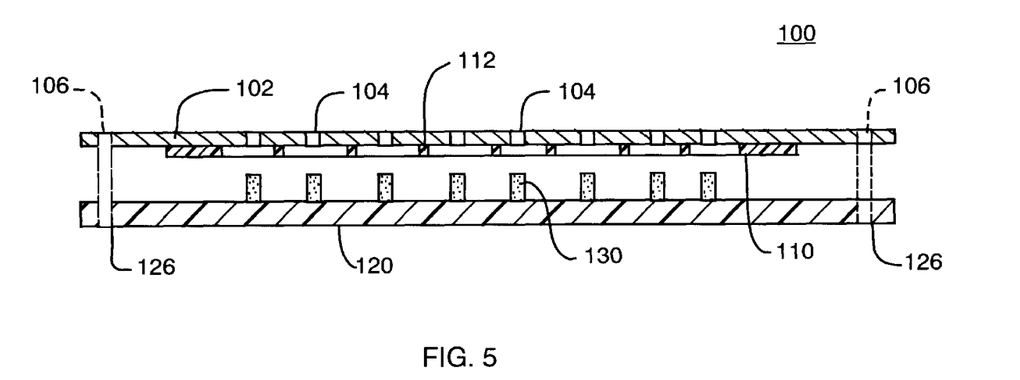
FIG. 5 is a side cross-sectional view of the exemplary stencil and the exemplary substrate of FIG. 4 with the exemplary stencil moved away from the exemplary substrate after deposition of conductive paste.

FIGS. 3 through 5 illustrate a sequence of relative positions of standoff stencil 100 formed of a metallic sheet 102 having a flexible standoff layer 110 thereon and a substrate 120 on which bumps of conductive paste 130 are deposited in accordance with the present invention. The standoff stencil 100 is placed against the substrate 120 with standoff features 112 touching substrate 120 to establish the spacing of metallic sheet 102 of standoff stencil 100 therefrom. Wet conductive paste is applied to standoff stencil 100 to flow through the openings 104 therein as far as substrate 120. The conductive paste 130 contacts and adheres to substrate 120. Standoff stencil 100 is then removed from substrate 120 leaving the deposited bumps 130 of wet conductive paste on substrate 120. The bumps of conductive paste 130 are dried or B-staged so as to be dry and tack-free bumps on substrate 120. Standoff stencil 100 is particularly advantageous for depositing fine features, i.e. features that are 100 microns or less in size, onto a substrate 120. In addition, standoff stencil 100 may be a screen or a stencil that is spaced apart from substrate 120 and pressed against substrate 120 during the deposition of conductive paste 130 as by a roller or squeegee, or may be a mask that is placed in contact with substrate 120 in preparation for such deposition of conductive paste.

FIG. 3 is a side cross-sectional view of an exemplary standoff stencil 100 that is positioned proximate an exemplary substrate 120 before deposition of a conductive paste, in accordance with the present invention.

Substrate 120, which may be a semiconductor die or wafer, an electronic substrate, a printed wiring circuit board or other substrate, has a pattern of sites on which are to be deposited bumps of conductive paste. Such sites include, for example, electrical contacts, contact pads, wire bond sites, conductive foils, conductive materials and the like. Where a set of two or more relational alignment holes 126 is utilized to precisely position substrate 120 in relation to standoff stencil 100, relational alignment holes 126 are positioned in a known predetermined positional relationship with the pattern of sites on substrate 120. A corresponding set of two or more relational alignment holes 106 in standoff stencil 100 are positioned in the same known predetermined positional relationship with respect to the pattern of openings 104 in standoff stencil 100 as are the relational alignment holes 126 with respect to the pattern of sites on substrate 120.

FIG. 4 is a side cross-sectional view of the exemplary standoff stencil 100 proximate the exemplary substrate 120 as in FIG. 3, but after the deposition of bumps of conductive paste 130. Conductive paste, such as solder paste, conductive polymeric adhesive in liquid or paste form, or other flowable conductive paste, is applied to standoff stencil 100 as by roller, squeegee or other applicator suitable to flow the conductive paste 130 into and through openings 104 in the thin metal sheet 102 of standoff stencil 100 until it contacts the sites on substrate 120. In effect, each of openings 104 acts as an extruding orifice through which a defined amount of the conductive paste 130 is extruded onto substrate 120. Note that because standoff features 112 of standoff stencil 100 are spaced away laterally from openings 104, conductive paste 130 does not touch standoff features 112, but contacts substrate 120 at the sites at which it is to be deposited and only contacts thin metal sheet 102 at the peripheral interior surface of the openings 104 therethrough. Because the thickness of thin metal sheet 102 is selected to be substantially less than the width of the openings 104, the area of contact of each bump of conductive paste 130 to substrate 120 is greater than or equal to that of its contact with opening 104, and so will adhere to substrate 120 when stencil 100 is removed.

FIG. 5 is a side cross-sectional view of the exemplary stencil 100 and the exemplary substrate 120 of FIG. 4 with the exemplary stencil 100 moved away from the exemplary substrate 120 after deposition of conductive paste 130 thereon. Wet bumps 130 of conductive paste are attached to the surface of substrate 120 in the sites or locations at which they were deposited through stencil 100, and in particular, in the positions of the openings 104 therein, and are free of the stencil 100. The height of bumps 130 is extended by the additional thickness of the standoff features 112 of stencil 100 because the height of bumps 130 is determined by the combined thickness of metal sheet 102 and standoff features 112 of stencil 100. The wet conductive paste bumps 130 are dried or B-staged and are thus dry to the touch and firmly attached to substrate 120, and the height thereof shrinks to about 20%–80%, but mor typically about 50%–70%, of their height when wet.

As a result, conductive paste bumps 130 that have very small cross-wise dimensions and yet are sufficiently tall to form reliable interconnections between the substrate 120 and the electronic or other component or substrate to which it is to be attached (or which are to be attached to it) are deposited by employing a standoff stencil 100. For example, 100-micron-high wet conductive paste bumps that are 50 microns in diameter may be deposited on a substrate at a 100-micron pitch by employing a standoff stencil that includes a 50-micron-thick metal sheet and 50-micron-high standoff features, and the conductive bumps will be about 60 microns high when dry. In this example, the diameter of the conductive paste bumps 130 is similar to the height of the standoff features 112 and the resulting wet conductive paste depositions 130 on substrate 120 are much higher than the thickness of the metal sheet 102 of the stencil. With the present invention, the thickness of the deposited conductive bumps may be at least 100% greater than the thickness of the metal sheet 102 of the mask or stencil 100, and can be 200% or more thereof, with features and spacings of either fine or normal size and pitch.

In one of the preferred embodiments, the flexible standoff layer 110 is formed by screening liquid paste adhesive onto areas spaced away laterally from the stenciling holes 104 of the metallic sheet 102 of standoff stencil 100 of proper design with respect to contact pads of a semiconductor wafer onto which conductive paste is to be deposited. The thickness of metal sheet 102 may be in the range of 25 to 75 microns in order to incorporate smaller features of about 25 to 100 micron crosswise dimension. The incorporation of the standoff layer 110 allows the total equivalent thickness of standoff stencil 100, i.e. the thickness of the metallic sheet 102 plus that of the standoff layer 110, to be substantially thicker than the openings 104 in metal sheet 102. For example, a 35-micron thick metallic sheet 102 having openings 104 of 50 microns diameter and a 50-micron thick standoff layer 110, the wet prints of conductive paste will be 85 microns high and the finished thickness of the dried conductive paste 130 will be in the range of 40–60 microns. If a conventional stencil not having a standoff layer were to be employed, the wet thickness of the conductive paste would be only the 35-micron thickness of the metallic stencil sheet and the dry conductive bumps only 20–25 microns thick would be produced. Bump heights of more than 50 microns are preferred for almost all of the applications in electronic bonding. Thus, the standoff stencil according to the present invention provides an easy and suitable means to overcome the short comings of the conventional thin stencils that would otherwise be required to produce conductive bumps of small diameter and pitch.

Modern screening deposition equipment suitable for use in conjunction with the present invention include equipment commercially available from companies such as M P M Corporation located in Franklin, Mass., D E K USA Incorporated located in Flemington, N.J., and Universal Instruments located in Binghamton, N.Y. Such equipment are equipped with automated alignment vision systems which ease the attaining of proper alignment between the stencil and the electronic substrate onto which material is to be deposited. The simple tooling of relational alignment holes as described herein allows low cost alignment and high volume and low cost deposition of the conductive paste. The present method is estimated to allow deposit of conductive bumps having controlled thickness (height) even at the very finest pitch described at a cost of less than U.S.$30 per 6-inch semiconductor wafer. This cost is dramatically lower than the current lowest cost of depositing solder bumps onto wafers of flip chip devices by conventional methods.

Figure 6:
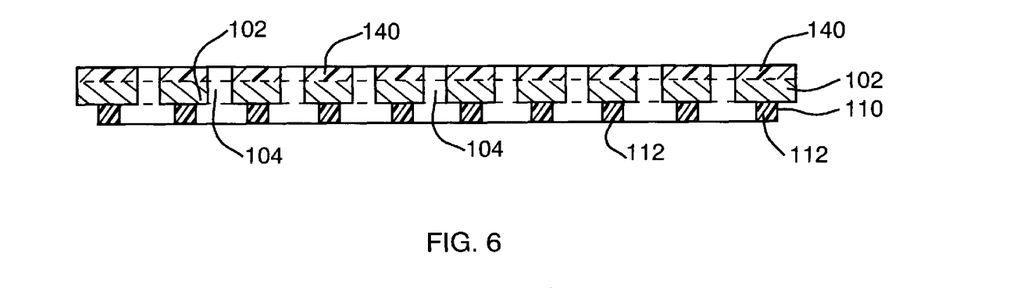
FIG. 6 is a cross-sectional view of an alternative embodiment of an exemplary stencil in accordance with the present invention.

FIG. 6 is a cross-sectional view of an alternative embodiment of standoff stencil 100 identified as standoff mask 100'. Standoff stencil 100 has reduced strength and may become susceptible to tearing when the thickness of metal sheet 102 is very thin, for example, less than about 50 microns. Standoff mask 100' overcomes this limitation and is similar to standoff stencil 100 described above insofar as metal sheet 102 and standoff layer 110 and features thereof are concerned. A flexible strengthening layer 140 is formed on the surface of metal sheet 102 opposite the surface thereof on which is standoff layer 110. Flexible strengthening layer 140 may be formed of flexible epoxy, cross-linkable epoxy, cross-linkable polyurethane, cross-linkable silicone, cured thermosetting and thermoplastic polymeric adhesives, and other suitable polymer coatings having a low surface energy, and may be applied onto metal sheet 102 through a screen, stencil or mask, or by printing, ink-jet printing or other suitable means for depositing a pattern of such material, by lamination or application of a preform, or may be patterned by photo-etching, photo-imaging and developing, or electroforming. The material selected for forming strengthening layer 140 should be resistant to the solvent or solvents employed in the conductive paste or pastes to be deposited using standoff stencil 100. Because the material of which strengthening layer 140 is formed has a low surface energy, i.e. less than 50 dyne/cm and preferably less than 40 dyne/cm, the conductive paste deposited therethrough will tend not to adhere thereto.

Moreover, in the embodiment of FIG. 6, the interior peripheral area of the openings 104 in metal sheet 102, which has a high surface energy and so tends to adhere to the conductive paste deposited therethrough, is reduced as compared to a metal stencil of like thickness. For example, the surface energy of brass is about 100 dyne/cm and of stainless steel is about 80 dyne/cm, both of which are substantially higher than the surface energy of the material of the flexible strengthening layer 140. As a result, the adherence of the conductive paste to the object onto which it is deposited, rather than to the stencil, is further enhanced.

The benefits of this arrangement can be exploited in several ways. For example, for any given stencil or mask opening size and conductive bump height, more consistent and uniform bump depositions may be achieved. Alternatively, for a given stencil or mask opening size, conductive bumps of greater height may be deposited. Further, smaller yet stencil or mask openings may be employed with minimum thickness stencils and masks to produce conductive bumps of finer size and pitch. Additionally, the thickness and therefore the strength of a stencil or mask may be increased without increasing the size of the minimum-sized bump that can be deposited thereby. Any one or more of the foregoing benefits may be realized in appropriately selecting the thicknesses of the metal sheet 102 and the flexible standoff and strengthening layers 110 and 140, respectively, of a particular stencil or mask.

In any of the foregoing embodiments, the metal sheet 102 of the mask or stencil 100 may be formed of a metal having ferromagnetic properties, such as iron, iron alloys, steel, magnetic stainless steel and the like, so as to be magnetically attracted by an electromagnet or permanent magnet. In addition, standoff layer 110, and if employed, flexible strengthening layer 140, may be formed of a material that is filled with particles having ferromagnetic properties, such as iron and nickel powders and flakes, so as to also be magnetically attracted by an electromagnet or permanent magnet. The mask 100 so constructed may be held in place against substrate 120 by an electromagnet positioned near the opposite surface of substrate 120. Preferably, the electromagnet is energizable in a controllable manner and is energized by a dc current or a smoothed AC current of controllable magnitude. A full description of such magnetic masks and the electromagnets for holding such masks in place is found in co-pending U.S. patent application Ser. No. 09/190,837, entitled "Method of Forming Fine Pitch Interconnections Employing Magnetic Masks" which application is hereby incorporated herein in its entirety by reference.

Figure 7:
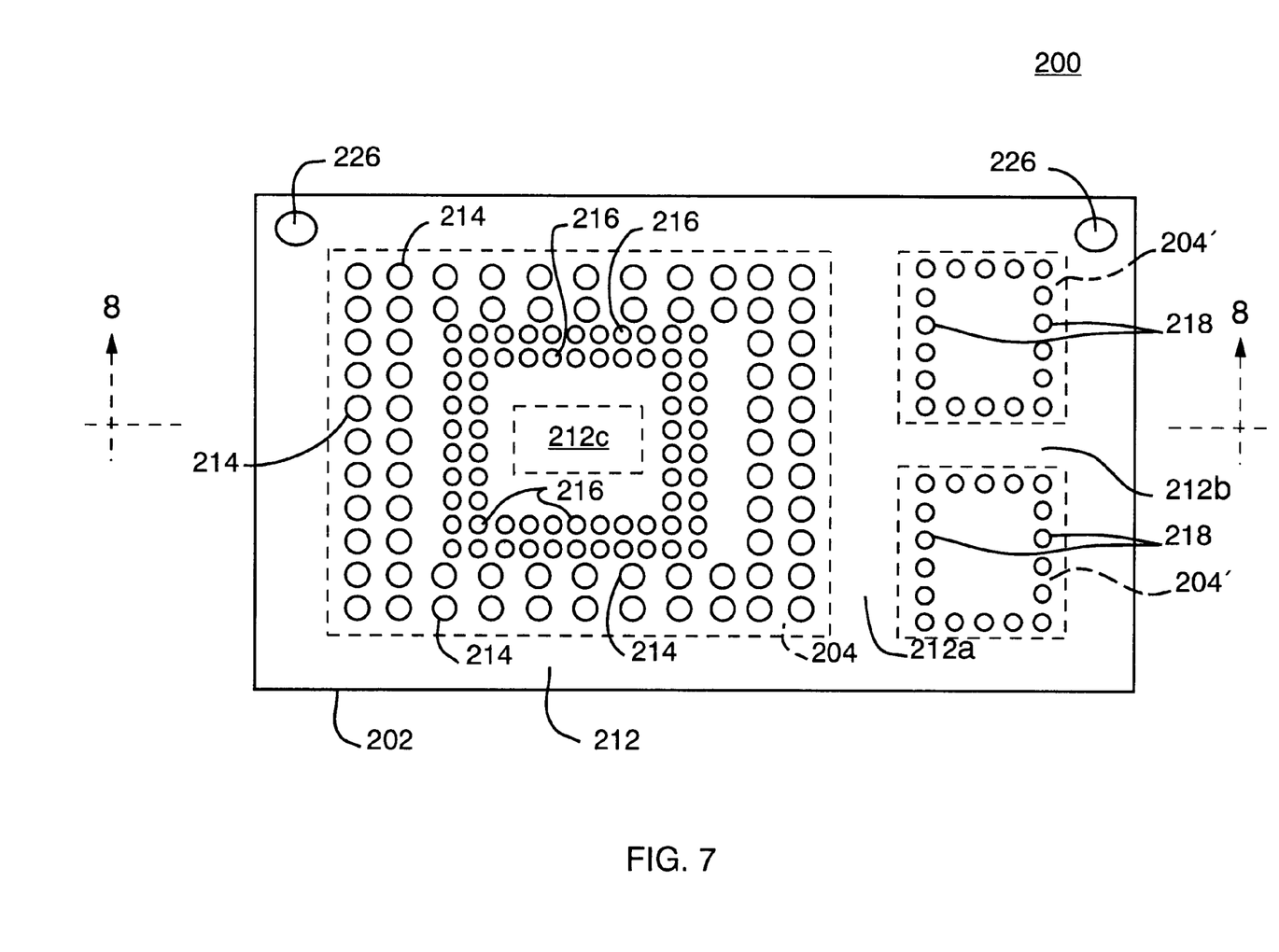
FIG. 7 is a top view of a further exemplary embodiment of a stencil according to the present invention.
Figure 8:
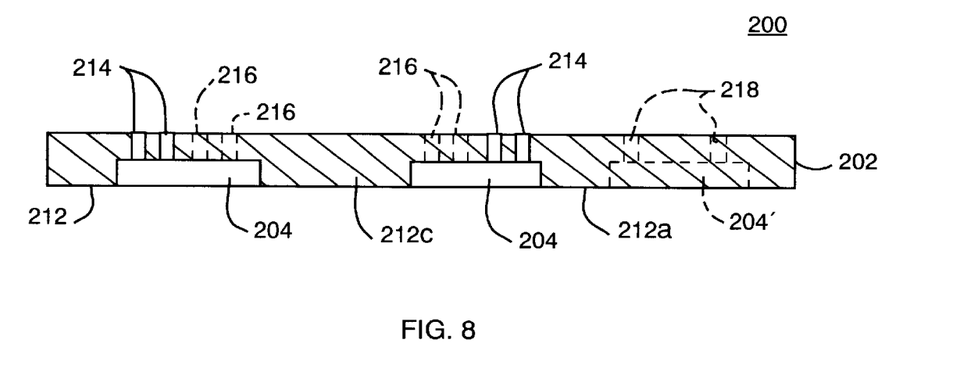
FIG. 8 is a cross-sectional view of the exemplary embodiment of the stencil of FIG. 7 taken at Section Line 8—8.

FIGS. 7 and 8 are a top view of an exemplary standoff stencil 200 and a cross-sectional view thereof taken at Section Line 8—8, respectively. By way of example, standoff stencil 200 includes a pattern of openings or holes 214, 216, 216 that is representative of three patterns of openings for three substrates or devices contained on a common substrate with which standoff stencil 200 is to be utilized.

Such substrates or devices may include, for example, three semiconductor devices formed on one semiconductor wafer or three electronic circuit substrates formed on a single panel of electronic circuit substrates. Standoff stencil 200 is formed of a sheet of suitable metal, such as stainless steel or brass, having cavities 204, 204' formed into one side thereof. Cavities 204, 204' may be photo-etched by applying, exposing, selectively removing a layer of photo-resist material to define the shapes of cavities 204, 204' and then etching the exposed portions of metal sheet 202, for example, to a depth of 2 mils in a 4-mil thick sheet of stainless steel. The forming of cavities 204, 204' leaves a 2-mil thick standoff layer 212, 212a, 212b, 212c on the remaining 2-mil thick portion of the 4-mil thick stainless steel sheet, including a peripheral standoff feature 212, an edge-to-edge standoff feature 212a, a bridging standoff feature 212b and a free-standing standoff feature 212c.

Then, a pattern of stencil openings 214, 216, 218 corresponding to the pattern, for example, of contact pads on the semiconductor wafer with which standoff stencil 200 is to be utilized, is etched through the 2-mil thick portion of stainless steel sheet 202 from the second side thereof to cavities 204, 204'. The features of standoff layer 212, 212a, 212b, 212c are laterally spaced away from stencil openings 214, 216, 218. A first exemplary pattern of stencil openings 214, 216 corresponding to contact pads of a first device on the semiconductor wafer which are in four rows around the periphery thereof, has two outer peripheral rows of 3-mil diameter openings 214 at a 6-mil pitch for depositing 3-mil diameter, 4-mil high bumps of conductive material on the semiconductor wafer and has two inner peripheral rows of 2-mil diameter openings 216 at a 4-mil pitch for depositing 2-mil diameter, 4-mil high bumps of conductive material on the semiconductor wafer. Standoff features 212 and 212a of standoff layer 212, 212a, 212b, 212c form a laterally spaced away peripheral standoff feature around the pattern of openings 214, 216, but it is not necessary that a standoff feature completely surround any pattern of openings. A standoff feature 212c is located in a central region of the pattern of openings 214, 216, as is convenient where the pattern of openings 214, 216 is a peripheral pattern, to support that portion of standoff stencil 200 during deposition, as is generally desirable where the pattern of holes is larger and the stencil is thinner.

Second and third exemplary patterns of openings 218 corresponding, for example, to contact pads of second and third devices on the semiconductor wafer, may be in different or like patterns. A second pattern of openings 218 are shown as being in one row around the periphery of a device, and a second pattern of openings 218 are shown as being in a rectangular array. In any case, openings 218 may be of like diameter and/or pitch or of mixed diameter and/or pitch, and may be of the same or different diameter and/or pitch as openings 214, 216, but are also for depositing 4-mil high bumps of conductive material on the semiconductor wafer. Standoff features 212, 212a and 212b form a laterally spaced away peripheral standoff feature around each pattern of openings 218, but it is not necessary that a standoff feature completely surround any pattern of openings. It is desirable, however, that the crosswise dimension of a standoff feature be wide enough to be in stable contact with the semiconductor wafer and not tip over or tilt in use, for example, at least 4–6 mils.

It is often convenient that standoff layer features such as features 212, 212a, 212b be located so as to correspond to areas between the individual semiconductor devices of the semiconductor wafer or between the individual circuit substrates of the panel of circuit substrates, as the case may be. Such areas, sometimes called "streets," are the areas through which the wafer or panel is cut to separate the individual devices or substrates therefrom. It is also convenient and desirable to include a set of relational alignment holes 226 in standoff stencil 200, wherein relational alignment holes 226 correspond to a like set of relational alignment holes in the semiconductor wafer or panel of circuit substrates with which standoff stencil 200 is to be utilized. Relational alignment holes 226 are in the same known predetermined positional relationship to the pattern of openings 214, 216, 218 of standoff stencil 200 as are the relational alignment holes of the wafer or panel to the pattern of contact pads thereon.

Figure 9:
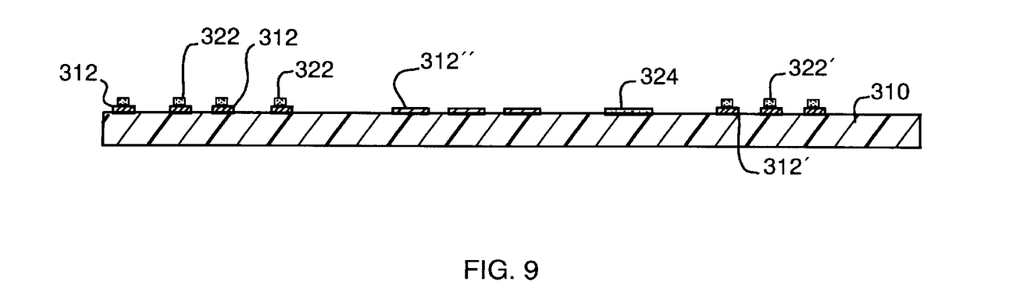
FIG. 9 is a cross-sectional view of an exemplary printed circuit substrate according to the method of the present invention.

FIG. 9 is a cross-sectional view of a printed wiring circuit board 310 having a pattern of contact pads 312, 312', 312" thereon. Two groups of contact pads 312, 312' have bumps of conductive adhesive 322, 322' deposited thereon in accordance with the method employing a standoff mask as described above, and are ready to receive electrical components not having conductive adhesive on their contact pads thereto. Contact pads 312" do not have conductive adhesive thereon and are ready to receive electrical components that have conductive adhesive bumps deposited on their contact pads in accordance with the method employing a standoff mask as described above. An area of adhesive 324 is deposited on circuit board 310 in accordance with the method described above, for example, in an area thereof not having a contact pad, for attaching an object to circuit board 310. Thus, circuit board 310 is prepared to receive electronic components and make electrical interconnections thereto.

Figure 10:
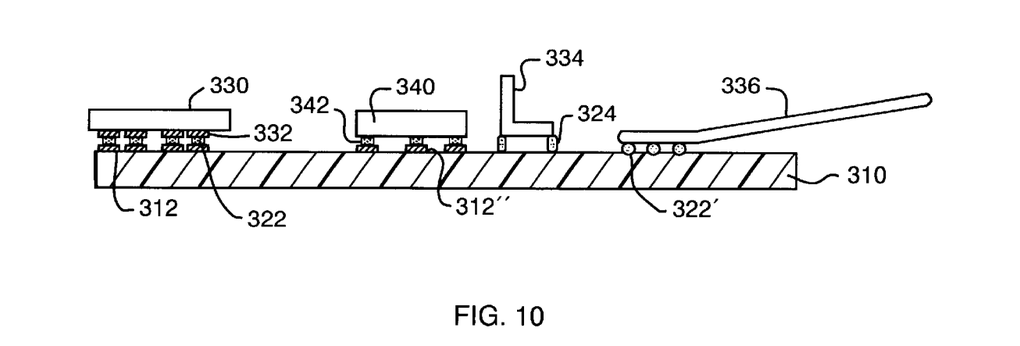
FIG. 10 is a cross-sectional view of an electronic device including the exemplary substrate of FIG. 9.

In FIG. 10, another cross-sectional diagram of printed wiring circuit board 310, electronic components and other objects have been attached to printed wiring circuit board 310 to form an electronic device. Electronic component 330, which may be a semiconductor flip chip device, a resistor, a capacitor, an inductor or other electronic component, has its contact pads interconnected to the corresponding contact pads 312 of circuit board 310 by the conductive adhesive bumps 322 that were deposited onto contact pads 312. A bond wire or connection jumper 336 is electrically connected to contact pads 312' of circuit board 310 by the conductive adhesive bumps 322' that were deposited on contact pads 312'. Electronic component 340, which may be a semiconductor flip chip device, a resistor, a capacitor, an inductor or other electronic component, has its contact pads interconnected to the corresponding contact pads 312" of circuit board 310 by the conductive adhesive bumps 342 that were deposited onto the contact pads of semiconductor flip chip 340. In addition, object 334, which may be a mounting bracket, heat sink, structural stiffener or other object, is attached to circuit board 310 by the adhesive 324 that was deposited on circuit board 310. Electronic components 330, 340, wire 336 and object 334 are heated to about 150° C. and pressed against circuit board 310, which has been heated to about 220° C. with a pressure of about 10 psi to form the polymer adhesive connections that attach such components and objects to circuit board 310.

Accordingly, it is seen that the present invention is useful for depositing patterns of adhesive bumps on substrates of various sizes and materials, and for doing so for very fine features and bumps as well as larger features and bumps.

EXAMPLE 1

Conductive bumps of 75-micron diameter, 100-micron height and 150-micron pitch are to be formed on contact pads of individual circuits formed, for example, on a 6-inch-diameter semiconductor wafer. A 50-micron thick sheet of stainless steel mask has openings corresponding to the pattern of contact pads photo-etched therein. The openings have a 75-micron diameter and are at a pitch of 150 microns. A standoff layer of insulating adhesive is then screened onto suitable places on the metal mask in locations spaced away laterally from the openings therein. The features of the standoff layer are designed to be of substantial size over 125 microns which allows the thickness of the insulating layer to be at least 60 microns thick, as exemplified by the masks 100 of FIGS. 1 and 2. In this example, a 75-micron thickness was used. The flexible insulating material of which the standoff layer is formed is type ME7850 epoxy adhesive available from AI Technology, Inc. located in Princeton, N.J., which is deposited by standard stencil or screening equipment having proper alignment provisions for application of features having the fine pitch described. The features of the standoff layer are spaced apart laterally from the openings in the metal sheet by 75 microns or more. If additional assistance for alignment of the standoff mask to the semiconductor wafer is required, more than two relational alignment holes may be formed in the semiconductor wafer substrate by a laser or other suitable means in a precise, known predetermined relationship with the pattern of contact pads thereon. Corresponding relational alignment holes will be formed in the metallic stencil or mask in the same known predetermined relationship to the pattern of openings therein which corresponds to the pattern of contact pads on the semiconductor wafer. The relational guide holes may be any size that is suitable for receiving a mechanical guide pin, and sizes used are approximately 0.025 inch diameter or larger. The standoff mask is aligned with and placed against the semiconductor wafer and electrically-conductive thermoplastic adhesive flowable paste type LTP8150-FP, also available from AI Technology, Inc. of Princeton, N.J. is deposited thereon by a conventional stenciling technique. A flood layer of the conductive paste is recommended to be maintained on the standoff mask during the deposition process. The type ME7850 insulating epoxy of which the standoff features are formed must be resistant to any solvent that may be used in the conductive paste, and is resistant to the ester alcohol solvent contained in type LTP8150-LP conductive paste. After the conductive adhesive paste has been deposited, the excess material is removed from the mask and the mask is removed from the semiconductor wafer. The wet thickness of the conductive bumps on the semiconductor wafer is 125 microns. The semiconductor wafer with deposited conductive adhesive bumps thereon is then placed in an oven at a temperature of 60–80° C. for 30–60 minutes until the bump is then completely dry to the touch. The dry conductive bumps have a height of about 75 microns. To promote additional adhesion of the conductive bumps to the contact pads of the semiconductor wafer, the adhesively-bumped wafer is placed on a hot-plate at a temperature of 200–230° C. for 10–30 seconds. The semiconductor wafer is then ready for dicing into individual semiconductor dies. The wafer or the singulated dies may be used immediately or may be stored at ambient temperature (i.e. 20–25° C.) for later use. The properties of the conductive adhesive bumps will not change materially for storage periods of up to 12 months, and perhaps longer. Individual dies are die-bonded in flip-chip manner to an electronic substrate at a temperature of 200–230° C., which is above the melt-flow temperature of the conductive adhesive bumps, to form an electronic device. The electronic device employing flip-chip devices thus bonded does not require an underfill material under the flip chip semiconductor die for normal use. In some cases, however, for protection against high-moisture and temperature, an underfill of a very flexible adhesive having a low glass transition temperature Tg, such as type MEE7650-5 thermosetting flexible epoxy adhesive available from AI Technology, is dispensed along the sides of each flip chip semiconductor die and is cured at a temperature of about 150° C. for 30 minutes.

EXAMPLE 2

Conductive bumps of 50-micron diameter, 75-micron height and 100-micron pitch are to be formed on contact pads of individual circuits formed on a 6-inch-diameter semiconductor wafer. The standoff mask is made from a magnetizable metal sheet of 50-micron thickness. Openings of 50-micron diameter and 100 micron pitch are first etched through the stainless steel sheet in a pattern corresponding to that of the contact pads on the semiconductor wafer. This mask is then coated with a 75-micron thick flexible standoff coating using type LESP7670 liquid thermosetting epoxy adhesive available from AI Technology and cured at a temperature of about 150° C. for about 30 minutes to produce a mask of the sort illustrated in FIG. 2 having cured standoff layer thickness of about 75 microns. The standoff layer is deposited by stenciling or screening wherein the stencil or screen is blocked or covered at the locations of the holes in the metal standoff mask by oversized covers so that the features of the standoff layer are spaced apart laterally from the openings in the metal sheet by 75 microns or more. Thus, the openings in the metal sheet remain open and are not plugged by the material of the standoff layer. The cured LESP7670 modified epoxy standoff layer is flexible and is solvent resistant. The standoff mask is then aligned with and placed against the semiconductor wafer as described in Example 1. Depositing of type LTP8150-FP electrically-conductive thermoplastic adhesive paste onto the semiconductor wafer and drying thereof is the same as in Example 1. A wet thickness of 125 microns is achieved and the dried conductive bumps of TP8150-FP have a finished thickness of about 75 microns. Also as in Example 1, the bumped flip chips may be bonded with or without underfill, however, if underfill is used, it must be similar in flexibility to that of type MEE7650-5, i.e. having a modulus of elasticity of about 10,000 psi or less. In addition, if low temperature exposure is expected, the glass transition temperature Tg of the underfill material should also be low and preferably below about −55° C.

EXAMPLE 3

Conductive bumps of 35-micron diameter, 60-micron height and 70-micron pitch are to be formed on contact pads of individual circuits formed on a semiconductor wafer. In this example, the mask is similar to the mask in Example 2, except that the diameter of the openings is 35 microns and the pitch is closer at 70 microns. The stainless steel metal sheet is 25 microns thick and the openings therethrough may be formed by photo-etching or the mask may be formed by electroplating. The total thickness of the standoff mask is 100 microns, including the 25-micron thick metal sheet and a 75-micron thick flexible epoxy standoff layer which is formed of type ME7850-SC epoxy, a faster curing version of type ME7850 epoxy, both of which are available from AI Technology, Inc. The features of the standoff layer are spaced apart laterally from the openings in the metal sheet by 50 microns or more. An electrically conductive thermosetting adhesive, such as type ESS8450 B-stageable epoxy also available from AI Technology, is deposited through the standoff mask to deposit 35-micron diameter, 100-micron high bumps of wet conductive adhesive onto the semiconductor wafer. Approximately 60% of the deposited wet height of 100 microns, or 60 microns, is retained after the conductive bumps are B-staged and dried at a temperature of 60–80° C. for 30–60 minutes. The semiconductor wafer with conductive epoxy bumps thereon may be diced and may be used immediately or stored at ambient temperature for later use. The properties of the conductive adhesive bumps will not change materially for storage periods of up to 12 months, and perhaps longer. Subsequently, flip chip bonding of individual devices to a circuit board may be obtained by aligning the pattern of conductive bumps on the individual device with the pattern of contact pads of the next level board, pressing the device against the circuit board with a pressure of about 10 psi and a curing temperature of 150–175° C. for approximately 1–5 minutes. Although an underfill is not required for devices so bonded, if underfill is employed, the underfill material must have similar flexibility to that of the conductive adhesive interconnections; for type ESS8450 conductive adhesive which has a modulus of elasticity of 20,000 psi and a glass transition temperature of −55° C., the underfill material modulus of elasticity should be in the range of 30,000 to 300,000 psi. While underfill materials having a lower modulus of elasticity may be utilized, materials having a modulus of elasticity greater than about 300,000 psi may produce excessive shear stress when exposed to low temperatures, such as −55° C., which can cause delamination failures.

EXAMPLE 4

Again, conductive bumps of 35-micron diameter, 60-micron height and 70-micron pitch are to be formed on contact pads of individual circuits formed on a semiconductor wafer. In this example, the mask is similar to the mask in Example 3 with 35-micron diameter openings and a 70-micron pitch. The stainless steel metal sheet is 100 microns thick and the standoff features and the openings therethrough are formed by photo-etching. One side of the metal sheet is photo-etched to a depth of 75 microns in a pattern to leave a pattern of 75-micron high standoff features. The pattern of holes is then photo-etched through the remaining 25-micron thick portions of the metal sheet to complete the standoff mask. The standoff features of the standoff mask are spaced apart laterally from the openings in the metal sheet by 50 microns or more, and typically are located in the "streets" between adjacent semiconductor die locations and in regions apart from clusters of holes corresponding to the contact pads of the semiconductor die. It is generally desirable that the standoff features be maximized in size, consistent with being laterally spaced away from the holes, so as to increase the ruggedness and durability of the standoff mask. Alternatively, some or all of the standoff features can be electroplated, electroformed or electrodeposited onto the 25-micron thick metal sheet using a compatible material, such as copper or nickel, also to increase the durability of the standoff mask. An electrically conductive thermosetting adhesive, such as type ESS8450 B-stageable epoxy, is deposited through the standoff mask to deposit 35-micron diameter, 100-micron high bumps of wet conductive adhesive onto the semiconductor wafer and is B-staged and dried at a temperature of 60–80° C. for 30–60 minutes, as in Example 3. The semiconductor wafer with conductive epoxy bumps thereon may be diced and may be used immediately or stored at ambient temperature for later use. Subsequently, flip chip bonding of individual devices to a circuit board may be obtained by aligning the pattern of conductive bumps on the individual device with the pattern of contact pads of the next level board, pressing the device against the circuit board with a pressure of about 10 psi and a curing temperature of 150–175° C. for approximately 1–5 minutes, as in Example 3.

While the present invention is generally described in relation to depositing conductive paste onto a semiconductor wafer to produce semiconductor die to be attached to a substrate, attachment of flip chips onto a circuit board or other substrate can also employ deposition of conductive paste onto one of or onto a panel of the next-level circuit boards or other substrates in accordance with the present invention. The depositions with magnetizable mask are particular useful for larger panel. In fact, plural or multiple circuit boards fabricated on an 18-inch panel are readily amenable to the stenciling/nasking and deposition method described in the foregoing Examples.

In the Examples 1–4 of which Examples 1, 2 and 3 were actually performed, the flexible standoff layer is actually thicker than is the metal sheet of the standoff stencil or mask. The flexible standoff features provide additional strength to the metal sheet for increased longevity of the standoff stencil or mask. In addition, all of the conductive pastes selected for precision deposition preferably have sufficiently high molecular weight to prevent movement of the adhesive paste after removal of mask, so that the wet deposited paste adhesive feature does not slump appreciably or bleed along the substrate due to the surface tension thereof, but substantially retains the shape, and particularly the height, it had with the mask in place. Even if the deposited paste adhesive features were to slump, they would not adhere to the standoff features due to the low surface energy thereof.

In the present invention, the use of a standoff layer or standoff features of substantial height on the stencil or mask is necessary for the deposition of conductive paste having a wet thickness greater than the thickness of the metal sheet and to produce the bump heights of conductive adhesive resulting therefrom.

In all of the above Examples, if the contact pads of the semiconductor wafer employ aluminum bond pads, the aluminum bond pads are passivated with nickel-gold layers or other non-oxidizing passivation materials, such as nickel-palladium. Where the conductive paste is a solder paste, the contact pads of the semiconductor device must include a solderable metallization to which the solder will adhere. Suitable solder pastes include fine powders of lead-alloy solders or lead-free alloy solders, or both, that reflow at temperatures below about 400° C. mixed with suitable binders and solvents, and are conventional and available from many sources. In addition, the conductive adhesives used (other than solder pastes) are all desirable because of their intrinsic flexibility as reflected by a low modulus of elasticity. These low-modulus of elasticity conductive adhesives are able to accommodate the mismatches between the respective coefficients of thermal expansion (CTE) of the semiconductor chips (CTE=3 ppmn/° C.) and the substrates to which they are bonded, such as to a ceramic substrate (CTE=7 ppm/° C.), to an FR4 substrate (CTE=17 ppm/° C.), and to a substrate built-up of layers of polymer (CTE=17–60 ppm/° C.).

While the present invention has been described in terms of the foregoing exemplary embodiments, variations within the scope and spirit of the present invention as defined by the claims following will be apparent to those skilled in the art. For example, while the embodiments described herein generally relate to forming small conductive bumps at fine pitch, the present invention also includes forming larger bumps at larger pitches, to tens or hundreds of mils in dimension or pitch, whatever may be needed in a particular instance. Similarly, the openings through metal sheet or membrane 102 may be square, rectangular, circular or of other shape, or combinations thereof, and may be of similar or different dimension and pitch.

In addition to solder pastes and conductive adhesive pastes described above, the conductive polymer adhesives may also include other precious metal conductive filler materials, such as type PSS8154 which is filled with gold-plated nickel flakes, type PSS8159 which is filled with gold-plated copper flakes, type PSS9158 which is filled with gold flakes, and type PSS8156 which is filled with silver-palladium alloy flakes, all available from AI Technology. While type PSS8159 is particularly cost effective from both a conductivity and a silver-migration prevention point of view, silver-filled polymer adhesives are the lowest cost conductive adhesives, and are reliable if a proper flexible underfill is employed to prevent silver migration.

Alternatively, the substrate onto which bumps of conductive paste are deposited in accordance with the present invention may be a sheet of release liner. After the bumps are deposited and dried on the release liner, the release liner is placed against an electronic substrate to which they are attached, as by heating of the electronic substrate.

As used herein, conductive paste may refer to solder pastes and slurries, conductive adhesives of any sort in liquid and/or paste form, and other materials suitable for deposition and forming of electrically conductive connections. Non-conductive materials may be rendered conductive by the addition of conductive filler materials, such as, for example, copper, aluminum, nickel, silver, gold, platinum, palladium and other conductive particles, and particles plated with materials such as silver, gold, palladium, platinum or other conductive metal, and alloys and combinations thereof.

Electronic devices including flip-chip components, flip-chip single-chip and multi-chip modules, fine-pitch surface mounting devices and modules, fine-pitch jumper interconnections, liquid crystal display interconnections, printed wiring circuit board assemblies, and other devices known to those of ordinary skill in the art may be made by employing the present invention.

In addition, the term "about" is intended to cover tolerances, production variations, measurement errors and uncertainties, and other sources of deviation which may cause the actual value of a parameter, dimension or condition to vary from that stated. The sizes and dimensions set forth herein are exemplary, and not indicative of any limitation in the application of the present invention. The standoff stencil or mask may be positioned in contact with a substrate to be used as a mask or may be positioned spaced slightly apart therefrom to be used as a stencil.

What is claimed is:

1. A method for forming a pattern of adhesive on a substrate, the pattern of adhesive having a height greater than a given height, comprising:

obtaining a substrate having a pattern of sites thereon which adhesive is to be deposited;

obtaining a standoff mask including a metal sheet of thickness substantially the given height having a pattern of openings corresponding to the pattern of sites and having standoff features thereon, wherein the standoff features are spaced away laterally from the openings and with said metal sheet define a thickness greater than the given height;

positioning said substrate and said standoff mask proximate each other with the standoff features proximate the substrate so that the pattern of sites and the pattern of openings correspond;

applying adhesive to substantially fill and pass through the openings of said standoff mask and to contact the sites on the substrate; and removing said standoff mask to leave said adhesive on said pattern of sites, whereby a pattern of adhesive having a height greater than the given height is formed on the substrate.

2. The method of claim 1 wherein said obtaining a standoff mask includes obtaining a sheet of metal, forming the pattern of openings therein, and forming the standoff features on at least one surface of said sheet of metal and spaced away from the openings therein.

3. The method of claim 2 wherein said metal is selected from the group including steel, carbon steel, stainless steel, magnetic stainless steel, nickel alloy, iron alloy, molybdenum, titanium and alloys, combinations and laminations thereof.

4. The method of claim 2 wherein said forming the pattern of openings includes at least one of photo-etching, laser machining, electroforming, and die cutting.

5. The method of claim 2 wherein said forming the standoff features includes forming a layer of flexible material having a surface energy of less than about 50 dyne/cm on at least one surface of said sheet of metal and spaced away from the openings therein.

6. The method of claim 2 further including forming a layer of flexible material having a surface energy of less than about 50 dyne/cm on a second surface of said sheet of metal and having openings therein corresponding to the openings in the sheet of metal.

7. The method of claim 1 wherein said obtaining a standoff mask includes obtaining a sheet of metal having first and second opposing surfaces, forming at least one cavity in the first surface of said sheet of metal to define the standoff features on at least the first surface thereof spaced away from locations at which the openings of the pattern of openings are formed, and forming the pattern of openings between the second surface and the at least one cavity of the sheet of metal.

8. The method of claim 1 wherein said obtaining a standoff mask includes obtaining a sheet of metal having first and second opposing surfaces, forming the pattern of openings between the first and second surfaces of the sheet of metal and forming standoff features on at least the first surface thereof spaced away from locations at which the openings of the pattern of openings are formed, wherein the standoff features are formed by selectively electroplating, selectively electroforming or selectively electro-depositing the same metal.

9. The method of claim 1 wherein obtaining a substrate includes obtaining a semiconductor wafer having a plurality of electrical circuits formed therein, each of said electrical circuits having contact pads that are included in said pattern of sites.

10. The method of claim 1 wherein obtaining a substrate includes obtaining a printed wiring circuit board having an electrical circuit wiring pattern thereon, wherein said electrical circuit wiring pattern includes contact pads that are included in said pattern of sites.

11. The method of claim 1 wherein positioning said substrate and said standoff mask includes aligning at least two relational alignment holes on said standoff mask with two corresponding relational alignment holes on said substrate, the relational alignment holes of said standoff mask being in known predetermined position with respect to said pattern of openings and the corresponding relational alignment holes of said substrate being in the same known predetermined position with respect to said pattern of sites.

12. The method of claim 11 wherein said aligning at least two relational alignment holes includes inserting respective alignment pins through each respective aligned pair of corresponding relational alignment holes of said standoff mask and said substrate.

13. The method of claim 1 wherein positioning said substrate and said standoff mask includes one of positioning said standoff mask against said substrate for use as a mask and positioning said standoff mask spaced apart from said substrate for use as a stencil.

14. The method of claim 1 wherein positioning said substrate and said standoff mask includes positioning said standoff mask spaced apart from said substrate and tensioning said standoff mask for use as a snap-back stencil.

15. The method of claim 1 wherein said applying adhesive includes applying a solder paste.

16. The method of claim 1 wherein said applying adhesive includes applying a flexible polymer adhesive selected from the group including thermoplastic resin and thermosetting resin.

17. The method of claim 1 wherein said applying adhesive includes applying a flexible polymer adhesive filled with sufficient electrically-conductive particles to render the flexible polymer adhesive electrically conductive.

18. The method of claim 17 wherein said electrically-conductive particles are selected from the group including gold, silver, platinum, palladium and alloys thereof and coatings thereof on a base material.

19. The method of claim 1 further comprising attaching said substrate to a device substrate having a pattern of sites thereon corresponding to the pattern of sites on said substrate, wherein corresponding sites of the respective patterns of sites are aligned and are joined by said adhesive.

20. The method of claim 19 wherein said attaching said substrate includes heating said substrate and said device substrate.

21. The method of claim 19 wherein said attaching said substrate includes pressing said substrate and said device substrate together.

22. The method of claim 1 wherein said obtaining a standoff mask includes obtaining a sheet of metal having the pattern of openings therein, forming a layer of flexible material on at least one surface of said sheet of metal material, and forming openings in said layer of flexible material that are substantially larger than corresponding ones of the openings in said sheet of metal so as to be spaced away laterally therefrom.

23. The method of claim 22 wherein said forming openings in said layer of flexible material includes forming openings that include a plurality of ones of the openings in said sheet of metal.

24. The method of claim 1 wherein at least ones of the sites of said pattern of sites have a pitch of less than 200 microns.

25. The method of claim 1 wherein at least one of said openings has a dimension of less than 300 microns.

26. The method of claim 1 wherein at least one of said openings has a dimension of less than 100 microns.

27. An electronic device made according to the method of claim 1.

28. An electronic device made according to the method of claim 19.

29. A standoff mask comprising a metal membrane of thickness substantially a given dimension having a pattern of openings therethrough and a patterned layer of flexible material on at least one side of said metal membrane, said patterned layer having a pattern of openings therethrough corresponding to the pattern of openings in said metal membrane, wherein said flexible material is spaced away laterally from at least one of the openings in said metal membrane, and wherein said metal membrane with said patterned layer defines a thickness greater than the given dimension, whereby material deposited through the pattern of openings of said metal membrane has a height greater than the given dimension.

30. The standoff mask of claim 29 wherein said flexible material is a flexible polymer adhesive having a surface energy less than about 50 dyne/cm.

31. The standoff mask of claim 29 wherein said metal membrane is formed of a metal selected from the group including steel, carbon steel, stainless steel, magnetic stainless steel, nickel alloy, iron alloy, molybdenum, titanium and alloys, combinations and laminations thereof.

32. The standoff mask of claim 29 wherein said patterned layer of flexible material defines standoff features on one surface of the sheet of metal spaced away from the openings of the pattern of openings, wherein the standoff features are formed by selectively electroplating, selectively electroforming or selectively electro-depositing the same metal onto the one surface of the sheet of metal.

33. The standoff mask of claim 29 wherein the openings in said metal membrane are formed by at least one of photo-etching, laser machining, electroforming, and die cutting.

34. The standoff mask of claim 29 further comprising a second patterned layer of flexible material formed on a second side of said metal membrane, said second patterned layer having a pattern of openings therethrough corresponding to the pattern of openings in said metal membrane, wherein said flexible material is a flexible polymer adhesive having a surface energy less than 50 dyne/cm.

35. The standoff mask of claim 29 wherein said metal membrane and said flexible layer each have a respective thickness, and wherein the aggregate of the respective thicknesses of said metal membrane and said flexible layer is no greater than 100 microns.

36. The standoff mask of claim 29 wherein said metal membrane and said flexible layer each have a respective thickness, and wherein the thickness of said metal membrane is less than the thickness of said flexible layer.

37. The standoff mask of claim 29 wherein at least ones of the openings through said metal membrane have a pitch of less than 200 microns.

38. The standoff mask of claim 37 wherein at least ones of the openings through said metal membrane have a pitch of less than 100 microns.

39. The standoff mask of claim 29 wherein at least one of said openings has a dimension of less than 200 microns.

40. The standoff mask of claim 39 wherein at least one of said openings has a dimension of less than 100 microns.

* * * * *